(12) United States Patent
Grannen et al.

(10) Patent No.: US 9,847,768 B2
(45) Date of Patent: Dec. 19, 2017

(54) POLARITY DETERMINING SEED LAYER AND METHOD OF FABRICATING PIEZOELECTRIC MATERIALS WITH SPECIFIC C-AXIS

(75) Inventors: Kevin Grannen, Thornton, CO (US); Chris Feng, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1830 days.

(21) Appl. No.: 12/623,746

(22) Filed: Nov. 23, 2009

(65) Prior Publication Data

US 2011/0121689 A1    May 26, 2011

(51) Int. Cl.
*H03H 9/02* (2006.01)
*C30B 23/02* (2006.01)
*C30B 25/02* (2006.01)
*C30B 29/40* (2006.01)

(52) U.S. Cl.
CPC ......... *H03H 9/02015* (2013.01); *C30B 23/02* (2013.01); *C30B 25/02* (2013.01); *C30B 29/406* (2013.01); *Y10T 29/42* (2015.01)

(58) Field of Classification Search
CPC .... H03H 9/02015; C30B 23/02; C30B 25/02; C30B 29/406
USPC .................................................. 310/320, 357
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,060,818 A | 5/2000 | Ruby et al. | |
| 6,107,721 A | 8/2000 | Lakin | |
| 6,507,983 B1 | 1/2003 | Ruby et al. | |
| 6,933,809 B2 | 8/2005 | Kyoung et al. | |
| 7,019,605 B2 | 3/2006 | Larson, III | |
| 7,235,462 B2 | 6/2007 | Letertre et al. | |
| 7,280,007 B2 | 10/2007 | Feng et al. | |
| 7,367,095 B2 * | 5/2008 | Larson et al. | 29/25.35 |
| 7,388,454 B2 | 6/2008 | Ruby et al. | |
| 7,629,865 B2 | 12/2009 | Ruby | |

(Continued)

OTHER PUBLICATIONS

R. Dalmau, et al. "AlN bulk crystals grown on SiC seeds", Journal of Crystal Growth 281, p. 68-74 (2005).

(Continued)

*Primary Examiner* — Derek Rosenau

(57) ABSTRACT

An acoustic resonator comprises a first electrode, a second electrode and a piezoelectric layer disposed between the first electrode and the second electrode, and comprising a C-axis having an orientation. A polarization-determining seed layer (PDSL) is disposed beneath the piezoelectric layer, the seed layer comprising a metal-nonmetal compound. A method of fabricating a piezoelectric layer over a substrate comprises forming a first layer of a polarization determining seed layer (PDSL) over the substrate. The method further comprises forming a second layer of the PDSL over the first layer. The method further comprises forming a first layer of a piezoelectric material over the second layer of the PDSL; and forming a second layer of the piezoelectric material over the first layer of the piezoelectric material. The piezoelectric material comprises a compression axis (C-axis) oriented along a first direction.

7 Claims, 6 Drawing Sheets

(56) References Cited

U.S. PATENT DOCUMENTS

| | | | |
|---|---|---|---|
| 7,889,024 B2 | 2/2011 | Bradley et al. | |
| 2003/0213964 A1* | 11/2003 | Flynn et al. | 257/85 |
| 2004/0188241 A1 | 9/2004 | Rich et al. | |
| 2007/0069225 A1 | 3/2007 | Krames et al. | |
| 2007/0205850 A1 | 9/2007 | Jamneala et al. | |
| 2010/0075175 A1* | 3/2010 | Poblenz et al. | 428/697 |
| 2010/0111808 A1* | 5/2010 | Pimputkar et al. | 423/409 |

OTHER PUBLICATIONS

Ambacher, "Growth and applications of Group III-nitrides", J. Phys. D: Appl. Phys. 31, p. 2653-2710 (1998).

M. Stutzman, et al. "Playing with Polarity", phys. stat. sol. (b) 228, No. 2, p. 505-512 (2001).

M.J. Murphy, et al. "Normal and Inverted AlGaN/GaN Based Piezoelectric Field Effect Transistors Grown by Plasma Induced Molecular Beam Epitaxy", MRS Internet J. Nitride Semicond. Res. 4S1, G8.4 (1999).

Puurunen, "Preparation by Atomic Layer Deposition and Characterisation of Catalyst Supports Surfaced With Aluminum Nitride", Dissertation for the Degree of Doctor of Science in Technology, Helsinki University of Technology, Espoo, Finland, Oct. 25, 2002.

Picosun, "Atomic Layer Deposition—The basic principles, film materials, and applications".

Paranjpe, et al. "Atomic Layer Deposition of AlOx for Thin Film Head Gap Applications", Journal of the Electrochemical Society 148, p. G465-G471 (2001).

* cited by examiner

POLARITY DETERMINING SEED LAYER AND METHOD OF FABRICATING PIEZOELECTRIC MATERIALS WITH SPECIFIC C-AXIS

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of acoustic resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

FBARs may comprise a membrane (also referred to as the acoustic stack) disposed over air. Often, such a structure comprises the membrane suspended over a cavity provided in a substrate over which the membrane is suspended. Other FBARs may be comprises the membrane formed over an acoustic mirror formed in the substrate. Regardless of whether the membrane is formed over air or over an acoustic mirror, the membrane comprises a piezoelectric layer disposed over a first electrode, and a second electrode disposed over the piezoelectric layer.

Among other applications, FBARs are used in communications devices for electrical filters, and in electrical devices for voltage transformer, to name merely a few applications. One type of electrical filter application of FBARs is a passband filter used in duplex communications. As is known by one of ordinary skill in the art, duplex filters are used to provide isolation between a transmit function of a duplexer and a receive function of the duplexer. Thus, two filters are provided, and each is designed to function within certain specifications that include prescribed pass-band transmission, out-of-band attenuation and roll-off, to name a few common specifications.

More and more there is a need for differential signal applications from a single ended input. This has led to the investigation of alternative filter arrangements.

One way of providing a single-ended to differential signal transformation in a filter application involves a device known as a balun. For example, the balun may be connected to an FBAR-based filter. Unfortunately, and among other drawbacks, the use of a balun adds another (external) element to circuit, driving the cost and size of the filter up.

One known resonator structure having a differential output comprises coupled mode resonators. Filters based on coupled mode acoustic resonators are often referred to as coupled resonator filters (CRFs). CRFs have been investigated and implemented to provide improved passband and isolation of the transmit band and receive band of duplexers, for example. Often known CRFs comprises separate FBARs connected to in an effort to provide better performance, such as by cancelling certain higher order modes. However, there are drawbacks to this known attempt. For example, the cancellation is poor at certain frequency ranges where parasitic lateral modes are found. Moreover, the quality (Q) factor in these separate FBAR configurations is degraded compared to known FBARs. The degradation in the Q factor is manifest in degradation in the insertion loss in the passband of the separate FBAR devices.

Another topology for CRFs comprises an upper FBAR and a lower FBAR, often with a layer of acoustic decoupling material between the two FBARs. The two electrodes of one of the FBARs comprise the differential outputs, and one of the inputs to the lower resonator provides the single-ended input. The second electrode provides the ground for the device. However, while the stacked-FBAR CRF shows promise from the perspective of improved performance and reduced area or footprint due to its vertical nature, in order to attain this structure, the orientation of the compression axes (c-axes) of individual piezoelectric materials must be tailored to the application. For example, it may be useful to provide one piezoelectric layer have its crystalline orientation (and thus the c-axis) in one direction, and the second piezoelectric layer to have its crystalline orientation anti-parallel to the c-axis of the first piezoelectric layer. However, using many known methods of fabricating piezoelectric layers, it is difficult to select the orientation of the piezoelectric crystal during fabrication, and especially on the same wafer.

There is a need, therefore, to tailor the orientation of the piezoelectric crystalline orientation that overcomes at least the shortcoming of known methods discussed above.

SUMMARY

In a representative embodiment, an acoustic resonator comprises a first electrode, a second electrode and a piezoelectric layer disposed between the first electrode and the second electrode, and comprising a C-axis having an orientation. A polarization-determining seed layer (PDSL) is disposed beneath the piezoelectric layer, the seed layer comprising a metal-nonmetal compound.

In another representative embodiment, a method of fabricating a piezoelectric layer over a substrate comprises forming a first layer of a polarization determining seed layer (PDSL) over the substrate. The method further comprises forming a second layer of the PDSL over the first layer. The method further comprises forming a first layer of a piezoelectric material over the second layer of the PDSL; and forming a second layer of the piezoelectric material over the first layer of the piezoelectric material. The piezoelectric material comprises a compression axis (C-axis) oriented along a first direction.

BRIEF DESCRIPTION OF THE DRAWINGS

The present teachings are best understood from the following detailed description when read with the accompany

DEFINED TERMINOLOGY

Figure 1A:
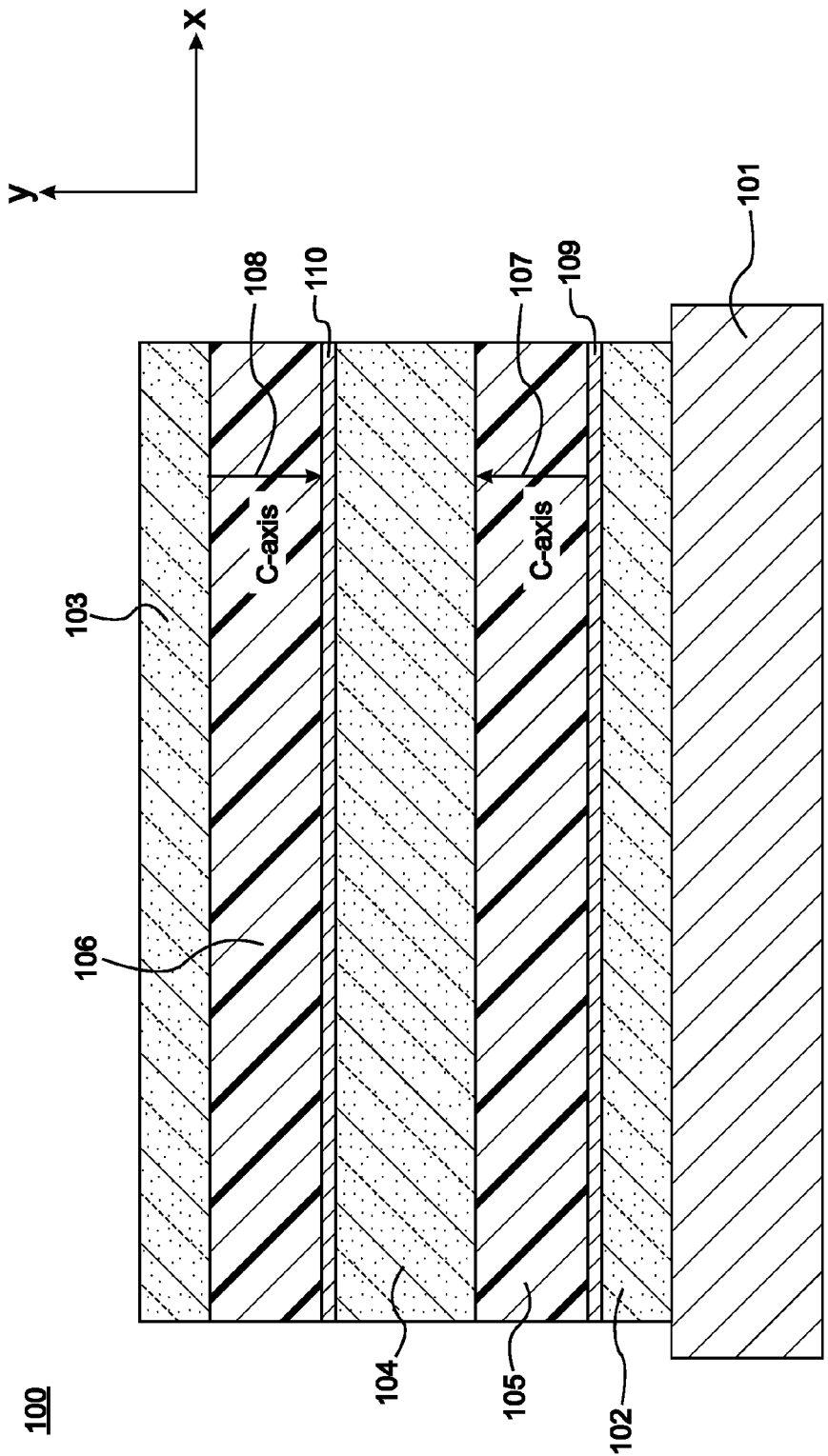
- FIG. 1A is a cross-sectional view of an acoustic resonator in accordance with a representative embodiment.

As used herein, the terms 'a' or 'an', as used herein are defined as one or more than one.

In addition to their ordinary meanings, the terms 'substantial' or 'substantially' mean to with acceptable limits or degree to one having ordinary skill in the art. For example, 'substantially cancelled' means that one skilled in the art would consider the cancellation to be acceptable.

In addition to their ordinary meanings, the terms 'approximately' mean to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Generally, it is understood that the drawings and the various elements depicted therein are not drawn to scale. Moreover, relative terms such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element.

Representative embodiments relate generally to acoustic resonators. Acoustic resonators described in connection with the representative embodiments are bulk acoustic wave (BAWs) resonators. Certain representative embodiment are described in connection with film bulk acoustic resonators (FBARs), which is a type of BAW device mounted over air or void. Commonly, FBARs comprise an acoustic membrane provided over a cavity in a substrate. Alternatively, FBARs comprise an acoustic membrane 'raised' up in a region over a substrate with a void (e.g., 'air') between an upper surface of the substrate and the lower surface of the acoustic membrane. Still alternatively, FBARs may comprise a BAW device disposed over an acoustic mirror comprising alternating layers of comparatively low acoustic impedance and high acoustic impedance. The layers of the acoustic mirror have a selected thickness (e.g., $\lambda/4$) to improve the performance of the FBAR. It is emphasized that the BAWs described in connection with the representative embodiments are intended to illustrate certain features described in connection with these embodiments, and are not intended to be limiting. As such, alternative structures comprising BAW devices that will be apparent to one of ordinary skill in the art having had the benefit of the present disclosure are also contemplated. Finally, other types of BAW devices are contemplated, some of which are described in connection with representative embodiments below. These include, but are not limited to stack bulk acoustic resonators (SBARs), double bulk acoustic resonators (DBARs) and coupled resonator filters (CRFs).

Certain aspects of the present teachings relate to and build upon components of FBAR devices, FBAR-based filters, their materials and methods of fabrication. Many details of FBARs, materials thereof and their methods of fabrication may be found in one or more of the following U.S. Patents: U.S. Pat. No. 6,107,721, to Lakin; U.S. Pat. Nos. 5,587,620, 5,873,153 and 6,507,983 to Ruby, et al.; U.S. Pat. No. 7,629,865; U.S. Pat. No. 7,280,007; and U.S. Pat. No. 8,981,876; and U.S. Pat. No. 7,388,454. The disclosures of these patents are specifically incorporated herein by reference. It is emphasized that the components, materials and method of fabrication described in these patents and patent application publications are representative and other methods of fabrication and materials within the purview of one of ordinary skill in the art are contemplated.

FIG. 1A shows a cross-sectional view of an acoustic resonator ('resonator') 100 in accordance with a representative embodiment. The resonator 100 comprises a substrate 101, first electrode 102, a second electrode 103 and a third electrode 104. A first piezoelectric layer 105 is disposed between the first electrode 102 and the third electrode 104; and a second piezoelectric layer 106 is disposed between the second electrode 103 and the third electrode 104. The first piezoelectric layer 105 comprises a C-axis 107 having a first orientation and the second piezoelectric layer 106 comprises a C-axis 108 that is substantially antiparallel to C-axis 107. In a representative embodiment, the first and second electrodes 102, 103 comprise molybdenum (Mo), and the first and second piezoelectric layers 105, 106 comprise aluminum nitride (AlN). These materials are merely illustrative and other materials within the purview of one of ordinary skill in the art are contemplated. For example, the first and second electrodes 102, 103 may comprise tungsten (W) and the first and second piezoelectric layers 105, 106 may comprise zinc oxide (ZnO) or lead zirconium titanate (PZT).

As is known, the expansion or contraction of the first and second piezoelectric layers 105, 106 depends on the orientation of the E-field (or more properly D-field) and the polarization (C-axis) of the piezoelectric material. A first polarity determining seed layer (PDSL) 109 is provided over the first electrode 102, and between the first electrode 102 and the first piezoelectric layer 105. A second PDSL 110 is provided over the third electrode 104 and between the third electrode 104 and the second piezoelectric layer 106. As described more fully herein, the first PDSL 109 and the second PDSL 110 are configured to so that first and second piezoelectric layers 105, 106, respectively, comprise a desired crystalline orientation, and therefore a desired polarization and C-axis. An acoustic reflector (not shown) such as a cavity, or acoustic mirror may be provided in the substrate 101. Alternatively, the resonator 100 may be raised over a void (not shown) over the substrate 101 to provide the acoustic reflector.

As should be appreciated by one of ordinary skill in the art, the antiparallel orientation of the C-axes 107, 108 and the selective application of voltages to the 102, 103, 104 will result in different oscillations of the various layers of the acoustic resonator, and thereby different applications of the resonator. For example, an acoustic resonator that transforms a single ended input to differential output may be realized with resonator 100. It is emphasized that this is merely an illustrative application of the resonator 100, and other applications to electrical filters and transformers are contemplated, to name only a couple of examples.

Figure 1B:
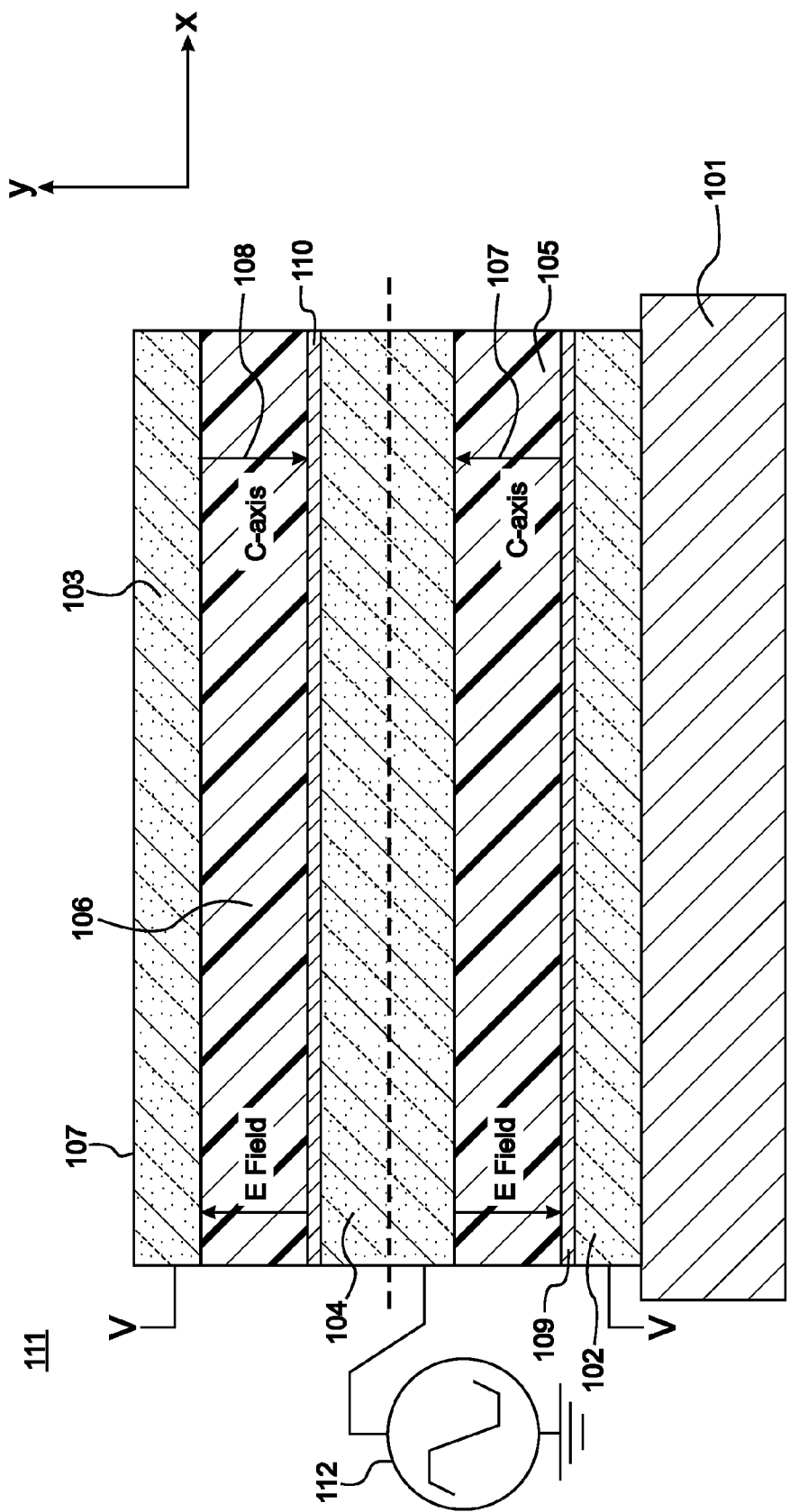
FIG. 1B is a cross-sectional view of an acoustic resonator in accordance with another representative embodiment.

FIG. 1B shows a cross-sectional view of an acoustic resonator 111 in accordance with another representative embodiment. The acoustic resonator 111 comprises substrate 101, first electrode 102, second electrode 103 and third electrode 104. The first piezoelectric layer 105 is disposed between the first electrode 102 and the third electrode 104; and the second piezoelectric layer 106 is disposed between the second electrode 103 and the third electrode 104. The first piezoelectric layer 105 comprises a C-axis 107 having a first orientation and the second piezoelectric layer 106 comprises a C-axis 108 that is substantially parallel to C-axis 107. As is known, the expansion or contraction of the first and second piezoelectric layers 105, 106 depends on the orientation of the E-field (or more properly D-field) and the polarization (C-axis) of the piezoelectric material. The first polarity determining seed layer (PDSL) 109 is provided over the first electrode 102, and between the first electrode 102 and the first piezoelectric layer 105. A second PDSL 110 is provided over the third electrode 104 and between the third electrode 104 and the second piezoelectric layer 106. As described more fully herein, the first PDSL 109 and the second PDSL 110 are configured to so that first and second piezoelectric layers 105, 106, respectively, comprise a desired crystalline orientation, and therefore a desired polarization and C-axis. An acoustic reflector (not shown) such as a cavity, or acoustic mirror may be provided in the substrate 101. Alternatively, the resonator 100 may be raised over a void (not shown) over the substrate 101 to provide the acoustic reflector.

Electrical connections to the resonator 100 may be configured in a various ways, however, the first electrode 102 and second electrode 103 are tied at a common electrical potential (absolute value V) to effect certain desired results described herein. In a representative embodiment, the third electrode is connected to a time-varying voltage source 112; whereas in other embodiments the first and third electrodes may be connected to the time varying voltage source 112 and the third electrode may be connected to another voltage. The first and second piezoelectric layers 105, 106 are illustratively AlN and exhibit substantial crystalline symmetry. Notably, the crystalline orientation of the first piezoelectric layer 105 is 'vertical' (e.g., in the +y direction in the coordinate system shown), and the crystalline orientation of the second piezoelectric layer 106 is parallel (i.e., also in the +y direction) to that of the first piezoelectric layer 105.

Further details of the acoustic resonator 111 are found in U.S. Pat. No. 7,889,024. The disclosure of this patent is specifically incorporated herein by reference.

Beneficially, the C-axes 107, 108 are oriented purposefully in parallel (both in the +y direction ((as shown) or both in the −y direction) to effect cancellation of second harmonic mixing products of an applied drive voltage. In particular, application of a voltage to the third electrode 104 results in an electric field generated across the first piezoelectric layer 105 and the second piezoelectric layer 106, and the inverse piezoelectric effect will result in the expansion or contraction of the piezoelectric material of the first and second layers 105 and 106. As is known, the expansion or contraction depends on the orientation of the E-field (or more properly D-field) and the polarization (C-axis) of the piezoelectric material. A time-varying E-field causes in alternating compression and expansion of the piezoelectric material, resulting in longitudinal acoustic modes (represented conceptually as 109) and lateral (transverse) acoustic modes (represented conceptually as 110) in the single acoustic resonant cavity 100.

As described more fully in U.S. Pat. No. 7,889,024, deleterious even order mode mixing products are substantially cancelled in single cavity acoustic resonators of the representative embodiments and filters comprising such single cavity acoustic resonators. The connection of the voltage source 112 to the third electrode 104 is merely illustrative, and connection of the voltage source 12 to the first and second electrodes 102, 103 is contemplated without modification of the acoustic resonator 111. In particular, because of the crystalline orientation of the first and second piezoelectric layers 105, 106, connection of the voltage source 112 to first and second electrodes 102, 103 will result (at a particular moment in time) in the application of an electric field vector parallel to the C-axis in one of the first and second piezoelectric layers 105, 106 and an electric field vector antiparallel to C-axis of the other of the first and second piezoelectric layers 105, 106.

Figure 2:
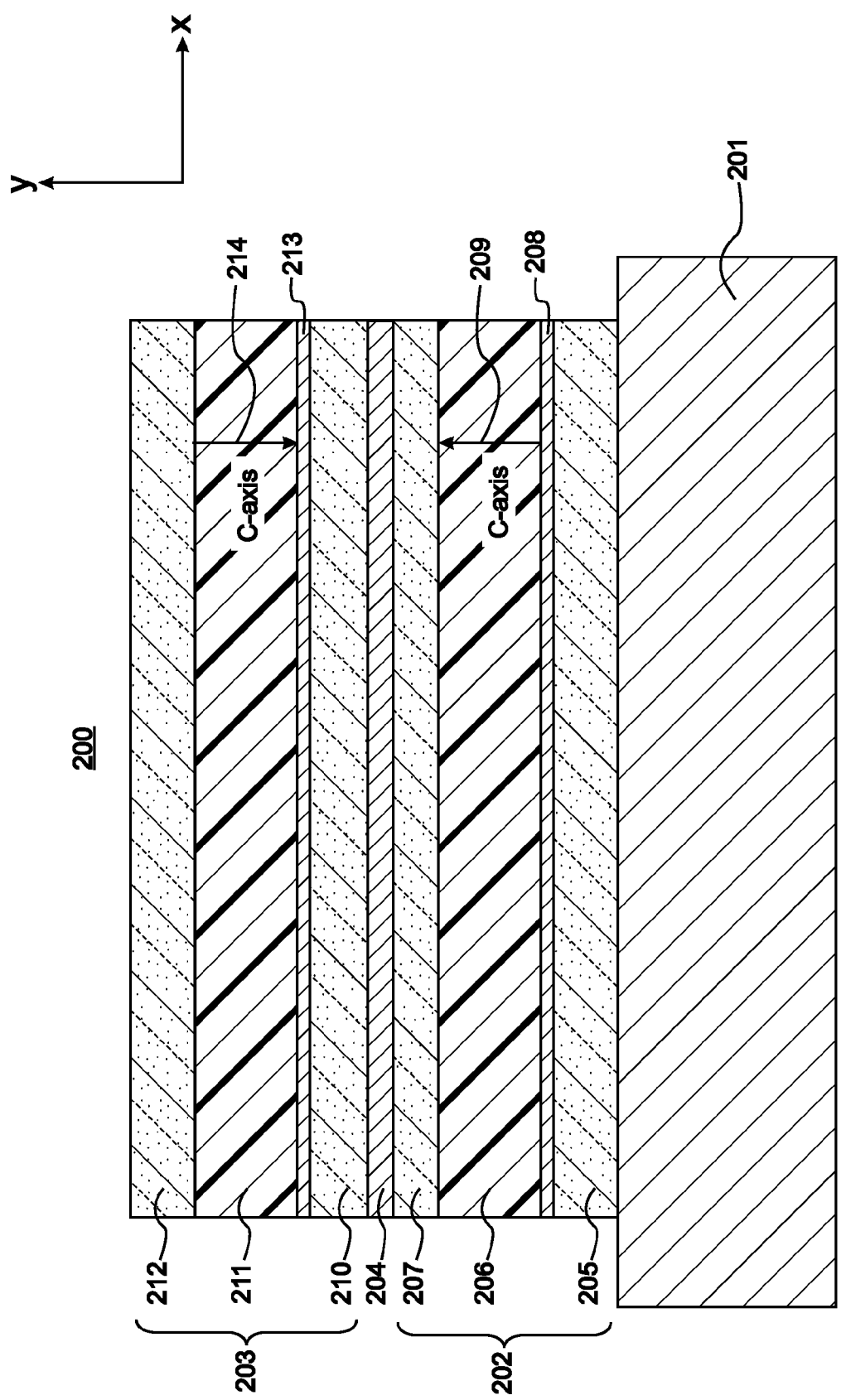
FIG. 2 is a cross-sectional view of an acoustic resonator in accordance with another representative embodiment.

FIG. 2 is a cross-sectional view of an acoustic resonator 200 in accordance with another representative embodiment. The acoustic resonator 200 comprises a substrate 201. A first FBAR 202 is disposed over the substrate 201, and a second FBAR 203 is disposed over the first FBAR 202. An acoustic decoupling layer 204 is provided between the first FBAR 202 and the second FBAR 203. The acoustic resonator 200 is a variation of a so-called SBAR. Additional details of certain features of the acoustic resonator 200 are found, for example, in U.S. Pat. No. 7,019,605 to Larson, III, et al., the disclosure of which is specifically incorporated herein by reference.

The first FBAR 202 comprises a first electrode 205, a first piezoelectric layer 206 and a second electrode 207. The first FBAR 202 also comprises a first PDSL 208, and the first piezoelectric layer 206 has a C-axis 209. The second FBAR 203 comprises a first electrode 210 a second piezoelectric layer 211 and a second electrode 212. A second (PDSL) 213 is provided over the first electrode 210, and between the first electrode 210 and the second piezoelectric layer 211. The second FBAR 203 comprises C-axis 214 that is antiparallel to C-axis 209 of the first FBAR 201. As described more fully herein, the first PDSL 208 and the second PDSL 213 are configured to so that first and second piezoelectric layers 206, 211, respectively, comprise a desired crystalline orientation, and therefore a desired polarization and C-axis. An acoustic reflector (not shown) such as a cavity, or acoustic mirror may be provided in the substrate 201. Alternatively, the acoustic resonator 200 may be raised over a void (not shown) over the substrate 201 to provide the acoustic reflector.

Illustratively, the piezoelectric layers of acoustic resonators of a representative embodiment comprise aluminum nitride (AlN). While the representative embodiments are directed to AlN piezoelectric layers comprising a C-axis and desired polarization formed over a substrate such as Mo or W and PDSL layers useful to that end, it is emphasized that the present teachings are not limited to these materials or combinations thereof. Other piezoelectric materials are contemplated as noted above, as are other substrate materials. As such, it is to be appreciated that other materials may be used for the PDSL layers, with the PDSL material selected to provide a desired crystalline orientation, polarization and C-axis in view of the selected piezoelectric material and substrate material.

Figure 3B:
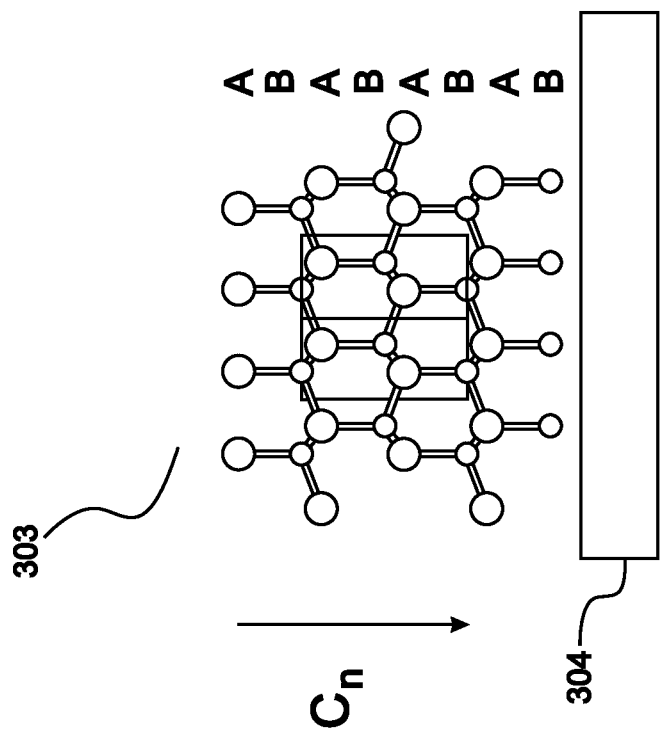
FIG. 3B is a conceptual view of a Type I piezoelectric layer disposed over a substrate.
Figure 3A:
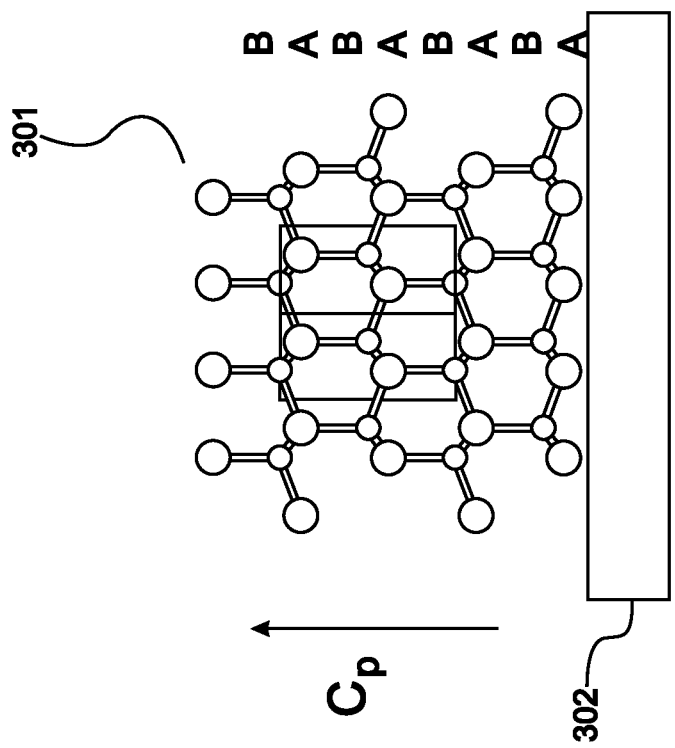
FIG. 3A is a conceptual view of a Type I piezoelectric layer disposed over a substrate.

Due to the nature of the Al—N bonding in a wurtzite structure, electric field polarization is present in AlN crystals. It is this polarization that results in the piezoelectric properties of aluminum nitride. In addition, polarization is termed positive or negative depending upon the crystalline orientation. FIGS. 3A, 3B depict two AlN crystals that have different polarizations based upon the crystal structure. In FIG. 3A, crystal 301 is disposed over a substrate 302 in ascending pattern ABABABAB in a specific crystalline orientation where A represents Al and B represents N. The resultant polarization of the crystal results in a C-axis vector ($C_p$) that is compression positive, and is often referred to as a Type I piezoelectric material. By contrast in FIG. 3B, crystal 303 is disposed over a substrate 304 in ascending pattern BABABA in a specific crystalline orientation where, again A represents Al and B represents N. The resultant polarization of the crystal results in a C-axis vector (Cn) that is compression negative, and is often referred to as a Type II piezoelectric material.

In accordance with representative embodiments described below, the selective fabrication of piezoelectric layers of a desired crystalline orientation and thus a desired polarization and C-axis vectors are facilitated by the fabrication of PDSLs by specifically layering constituent elements of the PDSL over a substrate prior to formation of the piezoelectric layer. Representative embodiments are described in connection with the fabrication of AlN piezoelectric layers and GaN PDSL layers. It is emphasized that this is merely illustrative, and other piezoelectric materials and PDLS materials are contemplated. More generally, the PDSL materials comprise a metal and a non-metal with the specific layering of the constituent metal and non-metal to form a desired crystalline orientation of the piezoelectric material and attendant desired polarization.

Gallium nitride (GaN) is a closely related compound in the same atomic family as AlN. GaN is a III-V semiconductor compound can be deposited in the hexagonal wurtzite structure and also exhibits polarity in its crystal lattice. The present teachings include depositing GaN with specific polarity. Thereafter, the GaN provides a template or seed layer upon which deposition of AlN continues. The specific polarity of the AlN is determined by terminal layer of the GaN. In particular, the GaN is deposited over a substrate of molybdenum (Mo) or Tungsten (W) (e.g., a material comprising an electrode of an FBAR device). Type I piezoelectric films are synthesized by providing a GaN layer over the substrate through a controlled deposition method so that the terminal layer is nitrogen. Bonding of aluminum is to this layer of nitrogen results in a Type I piezoelectric layer. Returning to FIG. 3A, the present teachings include providing substrate 302 with an electrode of the desired acoustic resonator, and forming the lattice structure ABABABABAB in an atomic layer by atomic layer fashion with the initial layer A being Ga, and the terminal layer B being N. With the crystalline template (i.e., crystal 301) of GaN formed over the substrate 302, the process continues with the forming of AlN, atomic layer by atomic layer, with the Al layer being the initial layer provided over the terminal N layer of the template GaN. The polarity of the AlN layer and its C-axis is thus established by terminating the template (crystal 301) of GaN with a layer of N, and therefore, the template functions as the PDSL of a representative embodiment.

Similarly, because the specific polarity of the AlN is determined by terminal layer of the GaN, the GaN is deposited over a substrate of Mo or Tungsten (W) (e.g., a material comprising an electrode of an FBAR device). Type II films are synthesized by providing a GaN layer over the substrate through a controlled deposition method so that the terminal layer is Ga. Bonding of nitrogen is to this layer of nitrogen results in a Type II piezoelectric layer. Similarly, and returning to FIG. 3B, the present teachings include providing substrate 304 with an electrode of the desired acoustic resonator, and forming the lattice structure BABABABA in an atomic layer by atomic layer fashion with the initial layer B being N, and the terminal layer A being Ga. With the crystalline template (i.e., crystal 303) of GaN formed over the substrate 304, the process continues with the forming of AlN, atomic layer by atomic layer, with N layer being the initial layer provided over the terminal Ga layer of the template GaN. The polarity of the AlN layer and its C-axis is thus established by terminating the template (crystal 303) of GaN with a layer of N, and therefore, the template functions as the PDSL of a representative embodiment.

Figure 4A:
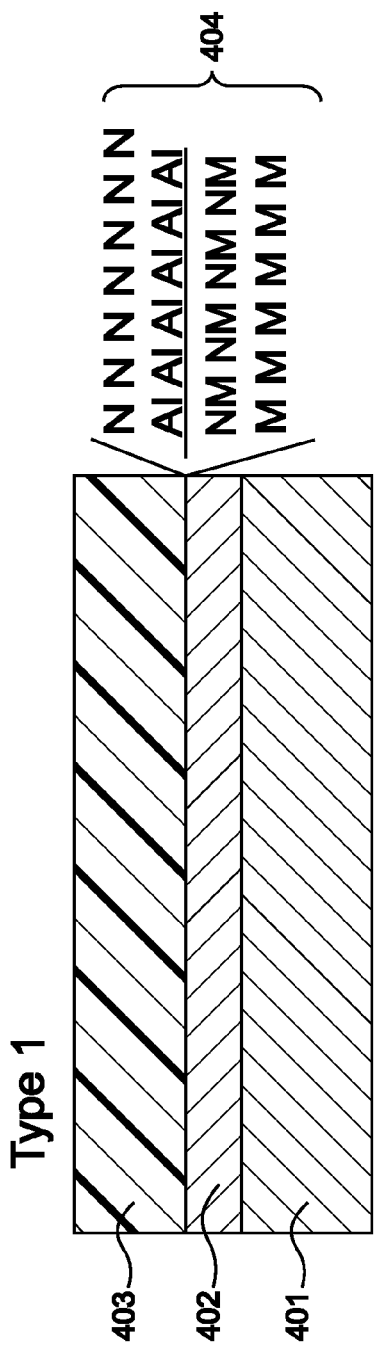
FIG. 4A is a cross-sectional view of a layer stack useful in an acoustic resonator in accordance with a representative embodiment.

FIG. 4A shows a cross-sectional view of a layer stack useful in an acoustic resonator in accordance with a representative embodiment. A substrate 401 is illustratively an electrode comprising a material such as W or Mo, or other material suitable as an electrode. A PDSL layer 402 is provided over the substrate 401 and comprises a crystalline structure useful as a template for fabricating a Type I piezoelectric layer 403 thereover. The interface 404 between the uppermost layers of the PDSL layer 402 and the lower most layer of the Type I piezoelectric layer 403 is depicted in FIG. 4A. The terminal two layers of the PDSL layer 402 comprise a metal layer with a non-metal layer disposed thereover. The initial layer of the Type I piezoelectric layer 403 is illustratively Al, and the next layer disposed over the Al layer is N.

As should be appreciated by one of ordinary skill in the art, the layer stack shown in FIG. 4A may be used in the fabrication of acoustic resonators described in connection with representative embodiments of FIGS. 1A-2. However, the layer stack shown in FIG. 4A is not intended to be limited only to acoustic resonators of the previously described representative embodiments, as the fabrication of the layer stack shown in FIG. 4A in other acoustic resonators is contemplated. Moreover, the layer stack of FIG. 4A is contemplated for use in other piezoelectric devices such as transformers and transducers comprising piezoelectric material. More generally, the fabrication of the PDSL layer 402 is contemplated for use in applications requiring at least one layer of Type I piezoelectric material.

Figure 4B:
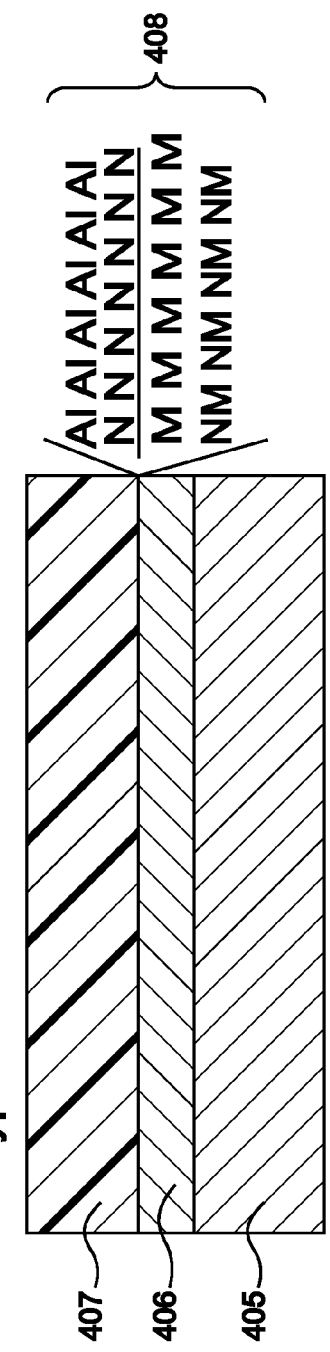
FIG. 4B is a cross-sectional view of a layer stack useful in an acoustic resonator in accordance with a representative embodiment.

FIG. 4B a cross-sectional view of a layer stack useful in an acoustic resonator in accordance with a representative embodiment. A substrate 405 is illustratively an electrode comprising a material such as W or Mo, or other material suitable as an electrode. A PDSL layer 406 is provided over the substrate 405 and comprises a crystalline structure useful as a template for fabricating a Type II piezoelectric layer 407 thereover. The interface between the uppermost layers of the PDSL layer 406 and the lower most layer of the Type II piezoelectric layer 407 is depicted in FIG. 4B. The terminal two layers of the PDSL layer 406 comprise a non-metal layer with a metal layer disposed thereover. The initial layer of the Type II piezoelectric layer 407 is illustratively N, and the next layer disposed over the N layer is Al.

As should be appreciated by one of ordinary skill in the art, the layer stack shown in FIG. 4B may be used in the fabrication of acoustic resonators described in connection with representative embodiments of FIGS. 1A-2. However, the layer stack shown in FIG. 4B is not intended to be limited only to acoustic resonators of the previously described representative embodiments, as the fabrication of the layer stack shown in FIG. 4B in other acoustic resonators is contemplated. Moreover, the layer stack of FIG. 4B is contemplated for use in other piezoelectric devices such as transformers and transducers comprising piezoelectric material. More generally, the fabrication of the PDSL layer 406 is contemplated for use in applications requiring at least one layer of Type II piezoelectric material.

In accordance with representative embodiments, by selectively controlling the growth of the atomic layers of PDSL layers 402, 406, the orientation of the AlN is pre-determined. If the PDSL is grown in such a way that it is terminated with a metal, then the AlN is forced to begin growing with the N-plane of its crystal structure. On the other hand if the PDSL crystal is grown in such a way that it is terminated with its non-metal layer, then the AlN is forced to grow with the Al-plane layer of its crystal structure. Each orientation of the AlN will have different material properties. In one embodiment, the PDSL could be 1000 Å or less in thickness while the AlN may be up several microns in thickness. FIG. 4 provides a schematic for the process involved.

In the illustrative embodiments, the PDSL layers 402, 406 comprise GaN. More generally, a metal (A)/non-metal (B) compound (AB) is contemplated for use as the PDSL layer with the order/orientation of the individual layers determining the polarity of the piezoelectric material deposited thereover. Illustrative materials contemplated for use as the PDSL layers 402, 406 may include, but are not limited to, nitrides of the following elements (In, Ga, Mo, Zr, Ti, Nb, Ta); oxides of the following elements (Al, Ti, Ta, Nb, Zr, Hf, Sn, Zn, La, Y, Ce, Sc, Er, V, Si, In, Cr, Ge, Mo, Pb); carbides of the following elements (Ti, Nb, Ta, V, Fe, W, etc); fluorides of the following elements (Ca, Zn, Sr); and sulfides of elements such as (Zn, Sr, Ca, Pb).

Figure 5:
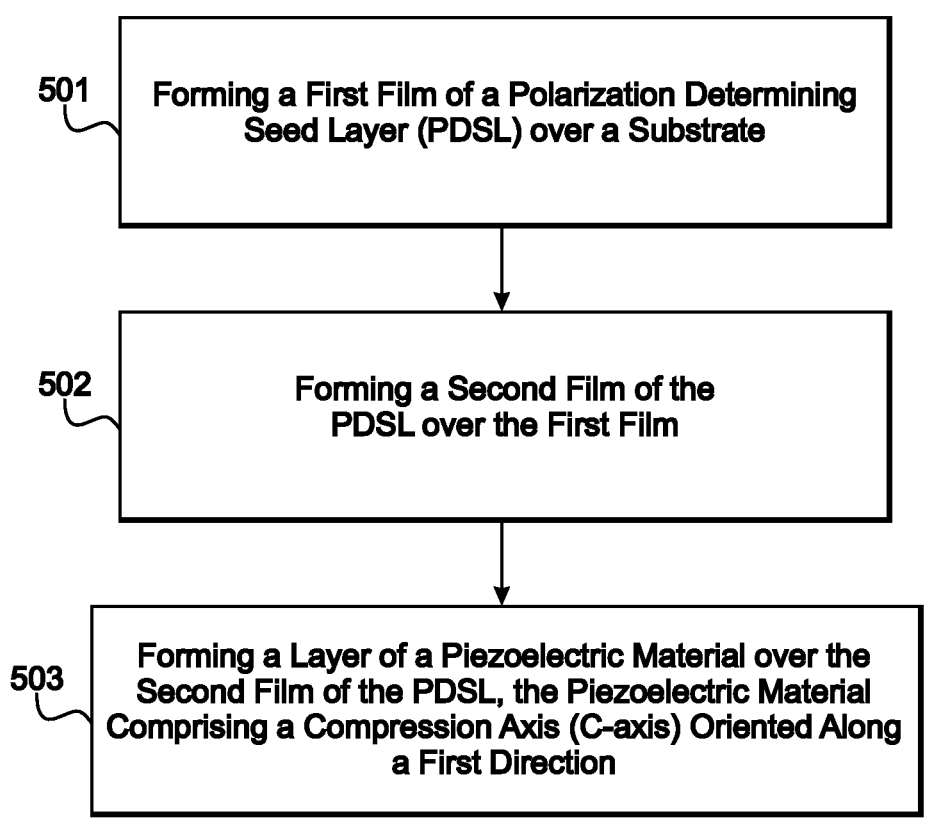
FIG. 5 is a flow-chart of a method of fabricating a piezoelectric layer with a specific crystalline orientation in accordance with a representative embodiment. representative embodiment.

FIG. 5 shows a flow-chart of a method 500 of fabricating a piezoelectric layer over a substrate in accordance with a representative embodiment. Many aspects of the method 500 are contemplated for the fabrication of the piezoelectric layers of the representative embodiments described above in connection with FIGS. 1-4B. Certain details of the materials and additional features of the devices of the representative embodiments provided above are not duplicated in order to avoid obscuring the description of the illustrative method. Moreover, the fabrication of other features (e.g., cavities or acoustic mirrors formed in the substrate of an FBAR) is not included in the description of the present method to avoid obscuring the description of the illustrative method. The formation of the components in the flow of the method will be understood by one of ordinary skill in the art, who has had the benefit of the present disclosure.

At 501, the method comprises forming a first film of a polarization determining seed layer (PDSL) over the substrate. The substrate is illustratively a metal layer (e.g., W or Mo) used for an electrode of the desired device. The first film comprises either a metal or a non-metal depending on the desired structure of the PDSL and the desired polarization of the piezoelectric layer formed thereover. For example, in a representative embodiment, the first film comprises either Ga or N. At 502, the method 500 comprises forming a second film of the PDSL over the first film. The second film comprises either a metal or a non-metal depending on the first film, the desired structure of the PDSL and the desired polarization of the piezoelectric layer formed thereover. For example, in a representative embodiment, the second film comprises either Ga or N, depending on the selected element for the first film.

The first and second films may be provided over the substrate one atomic layer at a time using one of two illustrative techniques, molecular beam epitaxy (MBE) and atomic layer deposition (ALD). In either case, and as should be appreciated by one of ordinary skill in the art, allow for growth of the PDSLs of the representative embodiments on a layer-by layer basis. Moreover, these methods allow for the selection of the initial layer of the PDSL and the terminal layer of the PDSL. Thus, the crystalline orientation of the PDSL is determined, and the polarity and C-axis of the desired piezoelectric layer are also determined.

Briefly, MBE utilizes ultra high vacuum (UHV) and individual sources of the film components. In an embodiment comprising a GaN PDSL, the gallium is vaporized and admitted into the UHV chamber and is adsorbed onto the substrate surface. After a suitable pumpout time, the nitrogen, in this case atomic nitrogen from a nitrogen plasma, is admitted into the chamber to react with the Ga previously adsorbed onto the surface. The UHV conditions minimize the adsorption and incorporation of other unwanted species into the growing film. By repeated Ga and N cycles, a crystalline film is grown on the substrate.

ALD is carried out occurs at comparatively high pressures and uses volatile organometallic precursors for the metal layer and gases for the non-metallic portion of the crystal. At a typical pressure of a few Torr and temperatures of a few hundred degrees Celsius, an organometallic gas, trimethylgallium, [Ga(CH$_3$)$_3$], for example, is admitted to the process chamber where it adsorbs onto a substrate to form a monolayer. The residual gas in the chamber is flushed and the next reactant gas, in this case ammonia (NH$_3$) is admitted into the reaction chamber. This ammonia reacts with the trimethylgallium to form GaN and gaseous byproducts:

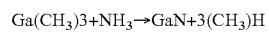

$$Ga(CH_3)_3 + NH_3 \rightarrow GaN + 3(CH_3)H$$

The NH$_3$ is then purged from the system by an inert carrier gas such as argon (Ar). By repeating these steps many times, a crystalline structure of GaN can be formed. Again, it is emphasized in addition to GaN, many different films can be deposited by this method to form PDSL layers useful in the formation of a piezoelectric layer having a desired crystalline orientation and therefore polarity. These alternative films include oxides, nitrides, metals, fluorides and carbides referenced above.

At 503 the method 500 comprises forming a layer of a piezoelectric material over the second film of the PDSL. Based on the selected PDSL layer and the terminal elemental film thereof, the layer of piezoelectric material comprises a compression axis (C-axis) oriented along a first direction.

In representative embodiments, method 500 fosters oriented growth of AlN using a selected PDSL. In fabricating a Type I piezoelectric material for the piezoelectric layer, as noted above, the final two layers formed in 501, 502 of the PDSL are a non-metal (M) and then a metal (NM). By having the metal as the final layer, the AlN is forced to grow with the initial layer being the aluminum layer (Al) while the second layer is nitrogen (N). In Type 2, the final two layers of the seed layer are a non-metal (NM) and then a metal (M). By having the metal as the final layer, the AlN is forced to grow with the initial layer being the aluminum layer (N) while the second layer is nitrogen (Al).

While MBE and ALD techniques are typically used to deposit thin films under 1000 A, some RF-MEMs devices that utilize AlN need films of up to 3 microns, approximately 30 times thicker than films deposited by MBE or ALD. To utilize this technique of depositing oriented AlN films in the RF-MEMS field requires a hybrid deposition process. The first approximately 1000 A, composed of the PDSL and the initial AlN layer, are deposited by MBE or ALD or a combination of the two while the remainder of the AlN layer is deposited by reactive sputtering.

In view of this disclosure it is noted that the various acoustic resonators and filters incorporating these resonators described herein can be implemented in a variety of materials, variant structures, configurations and topologies. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. An acoustic resonator, comprising:
   a substrate having a first side and a second side;
   a first electrode disposed over the first side of the substrate;
   a second electrode;
   a piezoelectric layer comprising aluminum nitride (AlN) disposed between the first electrode and the second electrode, and comprising a C-axis having an orientation; and
   a polarization-determining seed layer (PDSL) disposed over the first side of the substrate, and beneath the piezoelectric layer, the PDSL comprising gallium nitride (GaN), wherein neither AlN nor GaN are disposed on the second side of the substrate.

2. An acoustic resonator as claimed in claim 1, wherein the PDSL is disposed in an ascending pattern ABABABAB from a surface of the first electrode and in a crystalline orientation, or in an ascending pattern BABABABA from the surface of the first electrode in the crystalline orientation, where A is gallium and B is nitrogen.

3. An acoustic resonator as claimed in claim 2, wherein the C-axis orientation is compression positive ($C_p$) over the PDSL comprising the ascending pattern ABABABAB.

4. An acoustic resonator as claimed in claim 2, wherein the C-axis orientation is compression negative ($C_n$) over the PDSL comprising the ascending pattern BABABABA.

5. An acoustic resonator as claimed in claim 2, wherein the PDSL is a first PDSL, the piezoelectric layer is a first piezoelectric layer, and the C-axis is a first C-axis the acoustic resonator further comprising:
   a second piezoelectric layer disposed over the second electrode and comprising a second C-axis; and
   a second PDSL disposed between the second piezoelectric layer and the second electrode.

6. An acoustic resonator as claimed in claim 5, wherein the second C-axis is substantially antiparallel to the first C-axis.

7. An acoustic resonator as claimed in claim 5, wherein the second C-axis is substantially parallel to the first C-axis.

\* \* \* \* \*